United States Patent
Dehouwer

(10) Patent No.: US 9,378,453 B2
(45) Date of Patent: Jun. 28, 2016

(54) CARD AND METHOD FOR MANUFACTURING A CARD

(71) Applicant: CARTAMUNDI TURNHOUT NV, Turnhout (BE)

(72) Inventor: Marco Dehouwer, Vosselaar (BE)

(73) Assignee: CARTAMUNDI TURNHOUT NV, Turnhout (BE)

( * ) Notice: Subject to any disclaimer, the term of this patent is extended or adjusted under 35 U.S.C. 154(b) by 0 days.

(21) Appl. No.: 14/432,241

(22) PCT Filed: Sep. 23, 2013

(86) PCT No.: PCT/EP2013/069720
§ 371 (c)(1),
(2) Date: Mar. 30, 2015

(87) PCT Pub. No.: WO2014/048874
PCT Pub. Date: Apr. 3, 2014

(65) Prior Publication Data
US 2015/0242740 A1 Aug. 27, 2015

(30) Foreign Application Priority Data

Sep. 28, 2012 (EP) .................................. 12186530

(51) Int. Cl.
*G06K 19/077* (2006.01)
*G06K 7/08* (2006.01)
*G06K 19/067* (2006.01)
(52) U.S. Cl.
CPC .......... *G06K 19/07788* (2013.01); *G06K 7/081* (2013.01); *G06K 19/067* (2013.01)
(58) Field of Classification Search
USPC ....................................................... 235/451
IPC ................................. G06K 19/07788
See application file for complete search history.

(56) References Cited

U.S. PATENT DOCUMENTS 5,671,525 A * 9/1997 Fidalgo ............ G06K 19/07749
235/488
6,087,990 A * 7/2000 Thill .................... H01Q 1/3275
343/700 MS (Continued)

FOREIGN PATENT DOCUMENTS

| JP | 2000011119 A | 1/2000 |
| WO | 2010051802 A1 | 5/2010 |
| WO | 2011154524 A1 | 12/2011 |

OTHER PUBLICATIONS

European Search Report for corresponding European Application No. 12186530.7, Feb. 1, 2013.

(Continued)

*Primary Examiner* — Michael G Lee
*Assistant Examiner* — David Tardif
(74) *Attorney, Agent, or Firm* — Workman Nydegger

(57) ABSTRACT

A card, comprises an electrically non-conductive substrate; a first predetermined pattern of electrically conductive material applied on said electrically non-conductive substrate; and an electrically non-conductive covering layer applied on said electrically conductive material arranged on said substrate such that said first predetermined pattern of electrically conductive material is covered; said card further comprises a second predetermined pattern in a predetermined grey percentage applied on said electrically non-conductive substrate, said predetermined second pattern being the negative of said first predetermined pattern, and said electrically non-conductive covering layer is also applied on said second predetermined pattern such that said second predetermined pattern is covered, and the greyness of said second predetermined pattern has been determined such that the colour of the electrically non-conductive covering layer is uniform.

12 Claims, 2 Drawing Sheets

(56) References Cited

U.S. PATENT DOCUMENTS

| | | |
|---|---|---|
| 8,622,307 B2 | 1/2014 | Thiele et al. |
| 2011/0031319 A1* | 2/2011 | Kiekhaefer ............ G06K 19/02 235/492 |
| 2011/0253789 A1 | 10/2011 | Thiele et al. |
| 2013/0115878 A1 | 5/2013 | Thiele et al. |
| 2014/0332587 A1 | 11/2014 | Thiele et al. |
| 2015/0061942 A1* | 3/2015 | Koyama .................... G09F 9/00 343/700 MS |

OTHER PUBLICATIONS

International Search Report for corresponding International PCT Application No. PCT/EP2013/069720, Dec. 20, 2013.

* cited by examiner

CARD AND METHOD FOR MANUFACTURING A CARD

FIELD OF THE INVENTION

The present invention generally relates to cards comprising areas out of an electrically conductive layer which have to be covered with an electrically non-conductive layer. Such an electrically conductive layer can be formed out of a metal foil such as aluminium, copper, iron, or can also be formed out of a conductive ink or a conductive coating.

This invention for instance finds it application in interactive cards readable by capacitive sensing multi-touch devices having a capacitive sensing touch screen such as tablet pc's, smartphones, some types of game consoles, all-in-one computers, etc. Other known capacitive multi-touch sensors are however not excluded.

The present invention more specifically relates to a card, comprising
   an electrically non-conductive substrate;
   a first predetermined pattern of electrically conductive material applied on said electrically non-conductive substrate; and
   an electrically non-conductive covering layer applied on said electrically conductive material arranged on said substrate such that said first predetermined pattern of electrically conductive material is covered.

The present invention also relates to a method for manufacturing a card according to the invention, the method comprising the steps of
   providing an electrically non-conductive substrate;
   applying an electrically conductive material arranged in a first predetermined pattern on said electrically non-conductive substrate; and
   applying an electrically non-conductive covering layer on said electrically conductive material arranged on said substrate such that said first predetermined pattern of electrically conductive material is covered.

BACKGROUND OF THE INVENTION

At present, there already exist cards which are encoded with a pattern out of an electrically conductive layer in order to make them readable by means of a capacitive multi-touch sensor.

In WO 2010/051802 for instance, an information carrier is disclosed, comprising an electrically non-conductive substrate, an electrically non-conductive adhesive layer and an electrically conductive information layer. Furthermore, at least another layer is arranged which covers at least the area of the substrate with the structured information layer.

In WO 2011/154524, an information carrier is disclosed comprising a substrate with at least one layer which is applied area-wise and electrically conductive, with the layer being the touch structure. This touch structure comprises at least one conductive trace, a coupling surface and/or a touch point. On the substrate and the electrically conductive touch structure, at least one cover layer is situated in order to cover the touch structure not to damage it and to make it invisible.

Known cards having a predetermined pattern of an electrically conductive material all suffer from the drawback that, when on the electrically conductive pattern which is applied on the substrate of the card, a covering layer is applied, on the places where this covering layer covers the pattern of conductive material, a colour difference in this covering layer can be observed. The colour of this covering layer is thus uneven, which is not at all desirable. When for instance a white covering layer is applied over the substrate and over the electrically conductive pattern, the white does not appear evenly white on the places where this electrically conductive pattern is situated.

The problem underlying the invention puts himself with different colours of the electrically non-conductive covering layers. This problem especially occurs when said electrically non-conductive covering layer comprises a white covering layer which is applied on said electrically non-conductive substrate and said first predetermined pattern of electrically conductive material.

The problem underlying the invention furthermore also puts himself with different application techniques of this electrically non-conductive layer. This problem especially occurs when the electrically non-conductive covering layer is printed over the first predetermined pattern of electrically conductive material, especially when being digitally printed, since printing ink by definition is transparent and covering varnishes never cover for 100%. This problem however can also occur when a thin covering layer, for instance a thin paper layer, is laminated on said substrate and said first predetermined pattern of electrically conductive material.

A man skilled in the art being faced with this problem in the field of printing inks will have the normal reflex to apply several covering layers or a more opaque layer over the substrate and the electrically conductive pattern in order to ameliorate the colour difference in this covering layer. This solution however will not solve the problem underlying the invention.

There consequently exists the need to solve this problem.

SUMMARY OF THE INVENTION

According to a first aspect of the invention, there is provided a card, comprising
   an electrically non-conductive substrate;
   a first predetermined pattern of electrically conductive material applied on said electrically non-conductive substrate; and
   an electrically non-conductive covering layer applied on said electrically conductive material arranged on said substrate such that said first predetermined pattern of electrically conductive material is covered;
wherein said card further comprises a second predetermined pattern in a predetermined grey percentage or greyness applied on said electrically non-conductive substrate, said predetermined second pattern being the negative of said first predetermined pattern, and wherein said electrically non-conductive covering layer is also applied on
said second predetermined pattern such that said second predetermined pattern is covered, and wherein the greyness of said second predetermined pattern has been determined by the type and the colour of said electrically conductive material of said first predetermined pattern and the type and the colour of the electrically non-conductive covering layer, such that the colour of the electrically non-conductive covering layer is uniform.

Surprisingly, in this way, almost no or no colour difference at all is observable in the covering layer.

A balance has thus to be found between the colour of the first predetermined pattern, the colour of the negative of this first predetermined pattern and the covering ratio of the electrically non-conductive covering layer. If an information layer is applied on the electrically non-conductive covering layer, also this layer has to be taken into account in this balance.

In a possible embodiment of a card according to the invention, said electrically non-conductive covering layer comprises a white covering layer which is applied on said first predetermined pattern of electrically conductive material and said second predetermined pattern.

According to an exemplary embodiment, the predetermined pattern is formed out of a metal foil such as aluminium, copper, iron, or is formed out of a conductive ink or a conductive coating.

According to a further exemplary embodiment the non-conductive covering layer is covered by an information layer and on top of this information layer is a transparent coating layer extending over the whole surface of the card.

The invention also relates, in a second aspect, to a system comprising a card according to the first aspect further comprising a capacitive multi-touch sensor.

In a third aspect, the invention also relates to a method of capacitively detecting the electrically conductive material of the first predetermined pattern of a card according to the first aspect of the invention using a capacitive multi-touch sensor of the system according to the second aspect of the invention.

According to a fourth aspect of the invention, there is provided a method for manufacturing a card according to the first aspect, the method comprising the steps of
  providing an electrically non-conductive substrate;
  applying an electrically conductive material arranged in a first predetermined pattern on said electrically non-conductive substrate; and
  applying an electrically non-conductive covering layer on said electrically conductive material arranged on said substrate such that said first predetermined pattern of electrically conductive material is covered;
  determining the greyness of a second predetermined pattern by the type and the colour of said electrically conductive material of said first predetermined pattern and the type and the colour of the electrically non-conductive covering layer such that the electrically non-conductive covering layer has a uniform colour, said predetermined second pattern being the negative of said predetermined first pattern;
  applying a second predetermined pattern in a predetermined greyness on said electrically non-conductive substrate; and
  applying said electrically non-conductive covering layer on said second predetermined pattern such that said second predetermined pattern is covered.

In a preferred embodiment, the electrically non-conductive covering layer is printed on said first predetermined pattern of electrically conductive material and said second predetermined pattern.

According to a further embodiment, the first predetermined pattern of electrically conductive material is applied to the electrically non-conductive substrate in one or a combination of the following manners:
  applying a metal foil,
  printing an electrically conductive material,
  applying a conductive coating.

The metal foil may then be applied to this electrically non-conductive substrate by means of hot stamping or may be applied by affixing this metal foil to said the electrically non-conductive substrate by means of an adhesive layer.

Advantageously, the non-conductive covering layer is of uniform colour, preferably white.

According to a further embodiment, the method according to the fourth aspect further comprises the steps of
  applying on top of said electrically non-conductive covering layer an information layer; and
  applying on top of said information layer a transparent coating layer extending over the whole surface of said card.

DETAILED DESCRIPTION OF EMBODIMENT(S)

Figure 1:
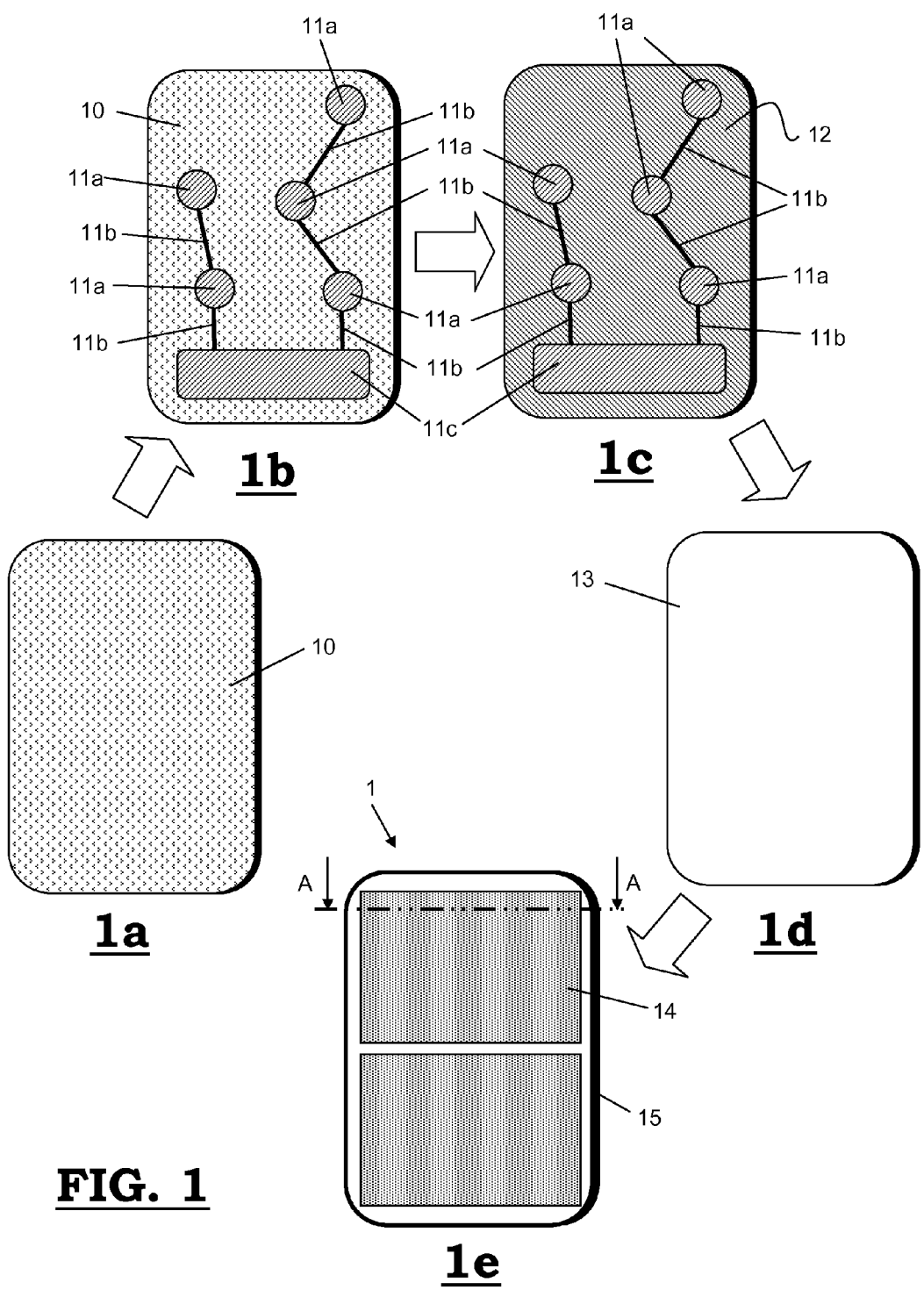
FIG. 1 illustrates the different production steps in FIGS. 1a-1e for manufacturing an exemplary embodiment of a card according to the invention.

A card (1) according to the invention essentially comprises the following layers:
  an electrically non-conductive substrate (10);
  an electrically conductive material arranged in a first predetermined pattern (11a-11c) which is applied on said substrate (10);
  a second predetermined pattern (12) in a predetermined grey percentage which is applied on said electrically non-conductive substrate (10), said second predetermined pattern (12) being the negative (inverse) of said first predetermined pattern (12) (see FIG. 1c); and
  an electrically non-conductive cover which is applied on (over) said electrically conductive material (11a-11c) which is arranged on said substrate (10) and said second predetermined pattern (12) such that predetermined patterns (11a-11c, 12) are covered.

The predetermined grey percentage of the second predetermined pattern (12) is therewith arranged such that, when said electrically non-conductive covering layer (13) is applied on (over) said electrically non-conductive substrate (10) and said first predetermined pattern (11a-11c) in order to cover both, when looking at said electrically non-conductive covering layer (13), said electrically non-conductive covering layer (13) has a uniform colour and said first predetermined pattern (11a-11c) of electrically conductive material is invisible.

This predetermined grey percentage is determined by the type and the colour of said electrically conductive material of said first predetermined pattern (11a-11c) and the type and the colour of the electrically non-conductive covering layer (13). More specifically, depending on the type of electrically conductive material of said first predetermined pattern (11a-11c), the grey percentage of the second predetermined pattern (12) is preferably between 5% and 20% and more preferably between 8% and 18%. As an example, when for instance the first predetermined pattern (11a-11c) is made out of aluminium, the grey percentage of the second predetermined pattern (12) is about 15%.

The electrically non-conductive substrate (10) can be made out of paperboard, paper, derived timber products, composite materials, laminates, synthetic material, etc.

The electrically conductive material which is arranged in a first predetermined pattern (11a-11c) can be formed out of a metal foil such as aluminium, copper, iron, or can be formed out of a conductive ink or a conductive coating. Preferably, the first predetermined pattern (11a-11c) is arranged as a metal foil out of aluminium. The metal foil for instance can be applied to the substrate (10) by means of hot stamping or can be affixed to the substrate (10) by means of an adhesive layer (20).

The method for manufacturing a card (1) according to the invention as described above comprises the steps of
- providing said electrically non-conductive substrate (10);
- applying said electrically conductive material arranged in a first predetermined pattern (11a-11c) on said electrically non-conductive substrate (10), and
- applying said second predetermined pattern (12) in a predetermined grey percentage on said electrically non-conductive substrate (10), said predetermined second pattern (12) being the negative of said predetermined first pattern (11a-11c); and
- applying said electrically non-conductive covering layer (13) on said first predetermined pattern (11a-11c) of electrically conductive material and said second predetermined pattern (12) such that both said first predetermined pattern (11a-11c) of electrically conductive material and said second predetermined pattern (12) are covered.

Figure 2:
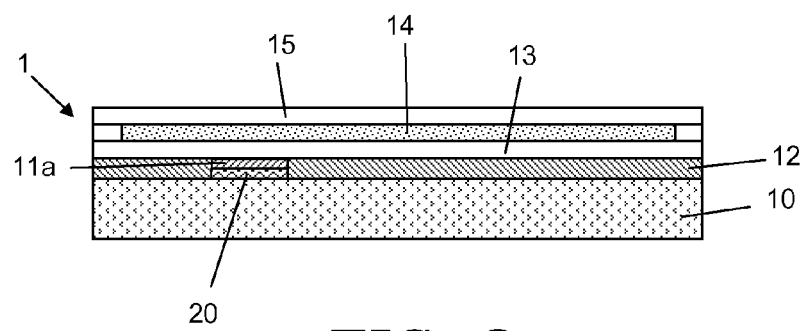
FIG. 2 illustrates a cross-section according to line A-A of this exemplary embodiment of the card according to the invention as illustrated in FIG. 1e.

As an example, in FIG. 2, a cross-section of a card (1) according to the invention is shown, this card (1) being configured to interact with a capacitive multi-touch sensor (not shown on the figures). In FIGS. 1a-1e, a method for manufacturing such a card (1) is shown.

The card (1) as shown in FIG. 2 comprises
- an electrically non-conductive substrate (10), preferably out of cardboard; 10
- a first predetermined pattern (11a-11c) which is applied on said substrate (10), preferably out of a metal foil which is affixed to the substrate (10) by means of an adhesive layer (20), said predetermined pattern (11a-11d) comprising
  - one or more capacitively detectable pattern elements (11a); and
  - one or more capacitive coupling elements (11c);
  wherein these capacitively detectable pattern elements (11a) and the coupling surfaces (11c) are arranged such that, when one or more touch elements which are configured to interact with the capacitive multi-touch sensor, such as human fingers, are coupled to one or more of the capacitive coupling elements (11c), the capacitively detectable pattern elements (11a) are capacitively detected by the capacitive multi-touch sensor;
- a second predetermined pattern (12) in a predetermined grey percentage which is preferably printed on said electrically non-conductive substrate (10), said second predetermined pattern (12) being the negative (inverse) of said first predetermined pattern (12) (see FIG. 1c); and
- an information layer (14), preferably being a printed layer; and
- a transparent coating layer (15) extending over the whole surface of the card (1), this transparent coating layer (15) preferably being a printed layer.

The first predetermined pattern (11a-11c) as shown in FIGS. 1b and 1c more specifically comprises
- a plurality of, in this specific embodiment, capacitively detectable round islands (11a) as the capacitively detectable pattern elements;
- a square island (11c) as the capacitive coupling element, and
- a plurality of non-capacitively detectable traces (11b), each trace (11b) connecting two of said capacitively detectable islands (11a).

It is herewith remarked that the first predetermined pattern (11a-11c) can be built out of any other number of capacitively detectable pattern elements (11a) in any other form and any other configuration and also any other number of capacitive coupling elements (11c) in any other form and any other configuration.

The grey percentage of the second predetermined pattern (12) therewith depends on the colour and the type of the ink used and the colour and the type of the electrically conductive material out of which the first predetermined pattern (11a-11c) is made.

The method steps for manufacturing the exemplary embodiment of the card (1) according to the invention as described above and as shown in FIG. 2 are the following:

FIG. 1a: providing the electrically non-conductive substrate (10), preferably out of cardboard;

FIG. 1b: applying the first predetermined pattern (11a-11c) on the electrically non-conductive substrate (10), preferably by affixing a metal foil pattern (11a-11d) to the substrate (10) by means of an adhesive layer (20), FIG. 1c: applying the second predetermined pattern (12) in a predetermined grey percentage on said electrically non-conductive substrate (10), the predetermined second pattern (12) being the negative of said predetermined first pattern (11a-11c), preferably by printing this second predetermined pattern (12);

FIG. 1d: applying the electrically non-conductive covering layer (13) on said first predetermined pattern (11a-11c) of electrically conductive material and said second predetermined pattern (12) such that both said first predetermined pattern (11a-11c) of electrically conductive material and said second predetermined pattern (12) are covered, preferably by printing this layer (13); and FIG. 1e: applying an information layer (14) and on top of this information layer (14) a transparent coating layer (15) extending over the whole surface of the card (1), both layers (14, 15) preferably being applied by printing them.

Although the present invention has been illustrated by reference to specific embodiments, it will be apparent to those skilled in the art that the invention is not limited to the details of the foregoing illustrative embodiments, and that the present invention may be embodied with various changes and modifications without departing from the scope thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein. In other words, it is contemplated to cover any and all modifications, variations or equivalents that fall within the scope of the basic underlying principles and whose essential attributes are claimed in this patent application. It will furthermore be understood by the reader of this patent application that the words "comprising" or "comprise" do not exclude other elements or steps, that the words "a" or "an" do not exclude a plurality, and that a single element, such as a computer system, a processor, or another integrated unit may fulfil the functions of several means recited in the claims. Any reference signs in the claims shall not be construed as limiting the respective claims concerned. The terms "first", "second", third", "a", "b", "c", and the like, when used in the description or in the claims are introduced to distinguish between similar elements or steps and are not necessarily describing a sequential or chronological order. Similarly, the terms "top", "bottom", "over", "under", and the like are introduced for descriptive purposes and not necessarily to denote relative positions. It is to be understood that the terms so used are interchangeable under appropriate circumstances and embodiments of the invention are capable of operating according to the present invention in other sequences, or in orientations different from the one(s) described or illustrated above.

The invention claimed is:

1. A card, comprising
   an electrically non-conductive substrate;
   a first predetermined pattern of electrically conductive material applied on said electrically non-conductive substrate; and an electrically non-conductive covering layer applied on said electrically conductive material arranged on said substrate such that said first predetermined pattern of electrically conductive material is covered;

wherein said card further comprises a second predetermined pattern in a predetermined greyness applied on said electrically non-conductive substrate, said predetermined second pattern being the negative of said first predetermined pattern, and in that said electrically non-conductive covering layer is also applied on said second predetermined pattern such that said second predetermined pattern is covered, and the greyness of said second predetermined pattern has been determined by the type and the colour of said electrically conductive material of said first predetermined pattern and the type and the colour of the electrically non-conductive covering layer, such that the colour of the electrically non-conductive covering layer is uniform.

2. A card according to claim 1, wherein said electrically non-conductive covering layer comprises a white covering layer which is applied on said first predetermined pattern of electrically conductive material and said second predetermined pattern.

3. A card according to claim 1, wherein said first predetermined pattern is formed out of a metal foil selected from the group consisting aluminium, copper, iron, and is formed out of a conductive ink or a conductive coating.

4. A card according to claim 1, wherein said non-conductive covering layer is covered by an information layer and on top of said information layer is a transparent coating layer extending over the whole surface of the card.

5. A system comprising a card according to claim 1, further comprising a capacitive multi-touch sensor.

6. A method of capacitively detecting said electrically conductive material of said first predetermined pattern of a card according to claim 1 using a capacitive multi-touch sensor of the system comprising a capacitive multi-touch sensor.

7. A method for manufacturing a card according to claim 1, the method comprising the steps of
    providing an electrically non-conductive substrate;
    applying an electrically conductive material arranged in a first predetermined pattern on said electrically non-conductive substrate; and
    applying an electrically non-conductive covering layer on said electrically conductive material arranged on said substrate such that said first predetermined pattern of electrically conductive material is covered;
wherein
the method further comprises the step of
    determining the greyness of a second predetermined pattern by the type and the colour of said electrically conductive material of said first predetermined pattern and the type and the colour of the electrically non-conductive covering layer such that the electrically non-conductive covering layer has a uniform colour, said predetermined second pattern being the negative of said predetermined first pattern;
    applying a second predetermined pattern in a predetermined greyness on said electrically non-conductive substrate, and
    applying said electrically non-conductive covering layer on said second predetermined pattern such that said second predetermined pattern is covered.

8. A method according to claim 7, wherein said electrically non-conductive covering layer is printed on said first predetermined pattern of electrically conductive material and said second predetermined pattern.

9. A method according to claim 7, wherein said first predetermined pattern of electrically conductive material is applied to said electrically non-conductive substrate in one or a combination of the following manners:
    applying a metal foil,
    printing an electrically conductive material,
    applying a conductive coating.

10. A method according to claim 9, wherein the metal foil is applied to said electrically non-conductive substrate by means of hot stamping or is applied by affixing said metal foil to said electrically non-conductive substrate by means of an adhesive layer.

11. A method according to claim 7, wherein said non-conductive covering layer is of uniform colour.

12. A method according to claim 7, wherein the method further comprises the steps of
    applying on top of said electrically non-conductive covering layer an information layer; and
    applying on top of said information layer a transparent coating layer extending over the whole surface of said card.

* * * * *